United States Patent
Holberg (10) Patent No.: US 6,288,661 B1
(45) Date of Patent: Sep. 11, 2001

(54) A/D CONVERTER WITH VOLTAGE/CHARGE SCALING

(75) Inventor: Douglas R. Holberg, Wimberley, TX (US)

(73) Assignee: Cygnal Integrated Products, Inc., Austin, TX (US)

( * ) Notice: Subject to any disclaimer, the term of this patent is extended or adjusted under 35 U.S.C. 154(b) by 0 days.

(21) Appl. No.: 09/419,148

(22) Filed: Oct. 15, 1999

(51) Int. Cl.[7] .............................. H03M 1/66; H03M 1/12
(52) U.S. Cl. ........................................... 341/145; 341/156
(58) Field of Search .................................. 341/155, 144, 341/145, 159, 172, 117, 118, 133, 136, 154, 163, 156

(56) References Cited

U.S. PATENT DOCUMENTS

| | | | |
|---|---|---|---|
| 4,338,591 | 7/1982 | Tuthill | 340/347 |
| 4,749,984 | * 6/1988 | Prost et al. | 341/156 |
| 5,220,483 | 6/1993 | Scott | 361/313 |
| 5,343,199 | 8/1994 | Sugawa | 341/159 |
| 5,581,252 | 12/1996 | Thomas | 341/144 |
| 5,617,091 | 4/1997 | Uda | 341/154 |
| 5,627,537 | * 5/1997 | Quinlan et al. | 341/144 |
| 5,703,588 | 12/1997 | Rivoir et al. | 341/159 |
| 5,731,775 | * 3/1998 | Gross, Jr. et al. | 341/155 |
| 6,137,430 | * 10/2000 | Lyden et al. | 341/145 |

OTHER PUBLICATIONS

A Monolithic Charge–Balancing Successive Approximation A/D Technique, Thomas P. Redfern, Joseph J. Connolly, Jr., Sing W. Chin and Thomas M. Frederiksen, *IEEE J. Solid State Circuits*, vol SC–14, pp. 912–920, Dec. 1979.

"High Resolution A/D Conversion in MOS/LSI"; Bahram Fotouhi and David A. Hodges; *IEEE J. Solid State Circuits*, vol SC–14, pp. 920–926, Dec. 1979.

"Technological Design Considerations for Monolithic MOS Switched–Capacitor Filtering Systems", David J. Allstot and William C. Black, Jr., *Proc.IEEE*, vol. 71, pp. 967–968, Aug. 1983.

"Error Correction Techniques for High–Performance Differential A/D Converters", Khen–Sang Tan, Sami Kiriaki, Michiel De Wit, John W. Fattaruso, Ching–Yuh Tsay, W. Edward Matthews and Richard K. Hester; *IEEE J. Solid State Circuits*, vol. 25, No. 6, Dec. 1990.

"A 12–b 5–MSample/s Two–Step CMOS A/D Converter", Behzad Razavi and Bruce A. Wooley,*IEEE J. Solid State Circuits*, vol. 27, No. 12, Dec. 1992.

"An IEEE 1451 Standard Transducer Interface Chip with 12–b ADC, Two 12–b DAC's, 10–kB Flash EEPROM, and 8–b Microcontroller", Tim Cummins, Eamonn Byrne, Dara Brannick and Dennis A. Dempsey, *IEEE J. Solid State Circuits*, vol. 33, No. 12, Dec. 1998.

* cited by examiner

*Primary Examiner*—Patrick Wamsley
(74) *Attorney, Agent, or Firm*—Howison, Chauza, Thoma, Handley & Arnott, LLP (57) ABSTRACT

An analog-to-digital converter having a digital-to-analog converter section for converting a Z-bit digital word. The digital-to-analog converter section includes an MSB portion for receiving a predetermined portion of the upper most significant bits, M bits, of the digital word and providing a monotonic division, $V_{INC}$, of a reference voltage to provide a first analog voltage. A SubDAC portion is provided for receiving the remaining portion of the digital word, N bits, and providing a monotonic division of the voltage $V_{INC}$ to provide a second analog voltage. A summing device sums the first analog voltage with the second analog voltage to provide an analog output voltage with an M+N bit resolution, Z=M+N.

17 Claims, 5 Drawing Sheets

A/D CONVERTER WITH VOLTAGE/CHARGE SCALING

TECHNICAL FIELD OF THE INVENTION

The present invention pertains in general to analog-to-digital converters and, more particularly, to a successive approximation register A\D converter utilizing a combination of a resistive DAC and a capacitive DAC.

BACKGROUND OF THE INVENTION

High-resolution successive-approximation analog-to-digital (A\D) converters suffer from the disadvantage that they require in-depth ratio-accurate circuit elements to achieve N-bit monotonic conversion, even if N-bit absolute accuracy is not required. As the number of bits, N, increases, the matching requirement on the circuit elements becomes tighter. One method to achieve tighter matching requirements in a monolithic integrated circuit is to increase the dimensions of the precision-ratioed elements in order to reduce the mismatch due to random edge variation caused during processing. This alternative, however, reduces the processing yield. A second alternative is to utilize on-chip trimming techniques.

In general, the A\D converter is made up of a digital-to-analog converter section (DAC) and a comparator. The DAC portion is the portion that requires tight matching of the selectable elements. In the capacitor DACs, various capacitors are utilized which are switched in and out of the circuit to provide the discrete steps. However, this can lead to non-monotonic behavior due to the mismatch between the capacitors. This situation is exacerbated as the resolution of the DAC increases. Monotonicity can be resolved by utilizing a resistor DAC which utilizes a resistor string. These are inherently monotonic.

Monotonic behavior is necessary for any control-system application. Although the resistor DAC will exhibit inherently monotonic behavior, it can become very large when implementing resolutions beyond the eight-bit level. For example, a nine-bit resistor DAC is roughly twice the size of an eight-bit resistor DAC. A ten-bit resistor DAC is roughly four times the size of an eight-bit resistor DAC. Moreover, a resistor DAC is most accurately implemented when the resistors are physically laid out in a linear fashion-one straight long resistor from end to end. As the resistor DAC resolution increases, this long resistor string can span one dimension of the chip and perhaps even push one dimension beyond this limit in order to accommodate the length of the resistor. Adding bends or serpentine sections to improve area use only increases the differential non-linearity (DNL) of the A/D converter performance. DNL performance of resistor DACs is very good due to the fact that DNL depends upon matching of adjacent unit components such that there are no major transitions where DNL is the most sensitive. The non-linearity performance of the resistor DACs is limited by the matching across the entire length of the string.

One type of resistor DAC that utilizes a smaller number of resistors to gain higher resolutions is that described in B. Fotouhi and D. H. Hodges, "High-Resolution A\D Conversion in MOS\LSI," IEEE J. Solid-State Circuits, vol. SC 14, pp. 920–926, Dec. 1979, which is incorporated herein by reference. Fotouhi discloses a successive approximation register DAC utilizing a resistor string combined with a binary weighted capacitor string. It employs an M-bit resistor string with a K-bit binary ratioed capacitor array to achieve N equal M+K conversion. The resistor string provides an inherently monotonic division of the referenced voltage into $2^M$ nominally identical voltage segments. The binary weighted-capacitor array is then used to subdivide any one of the segment voltages derived from the resistor string into $2^K$ levels. One disadvantage to this system is that the first division provided by the resistor string, although being inherently monotonic, does not carry over into the switching of the capacitors, since they lack the monotonicity of the resistor string.

SUMMARY OF THE INVENTION

The present invention disclosed and claimed herein comprises an analog-to-digital converter having a digital-to-analog converter section for converting a Z-bit digital word. The digital-to-analog converter section includes an MSB portion for receiving a predetermined portion of the upper most significant bits, M bits, of the digital word and providing a monotonic division, $V_{INC}$, of a reference voltage to provide a first analog voltage. A SubDAC portion is provided for receiving the remaining portion of the digital word, N bits, and providing a monotonic division of the voltage $V_{INC}$ to provide a second analog voltage. A summing device sums the first analog voltage with the second analog voltage to provide an analog output voltage with an M+N bit resolution, Z=M+N.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
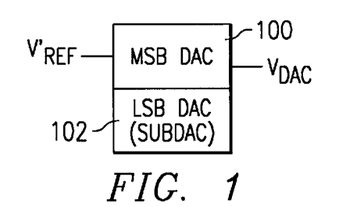
FIG. 1 illustrates a top level block diagram of the DAC portion of the A\D converter.

Referring now to FIG. 1, there is illustrated a diagrammatic view of the DAC portion of the analog-to-digital converter (A\D converter), as will be described in more detail hereinbelow. The DAC is comprised of an MSB DAC 100 and an LSB DAC 102, referred to as a "SubDAC." A voltage reference, $V'_{REF}$, is provided and will output a DAC voltage $V_{DAC}$. As will be described hereinbelow, the MSB DAC 100 is associated with a predetermined number of the most significant digits in the DAC output, and the LSB DAC 102 is associated with the remaining least significant bits of the DAC output.

Figure 2:
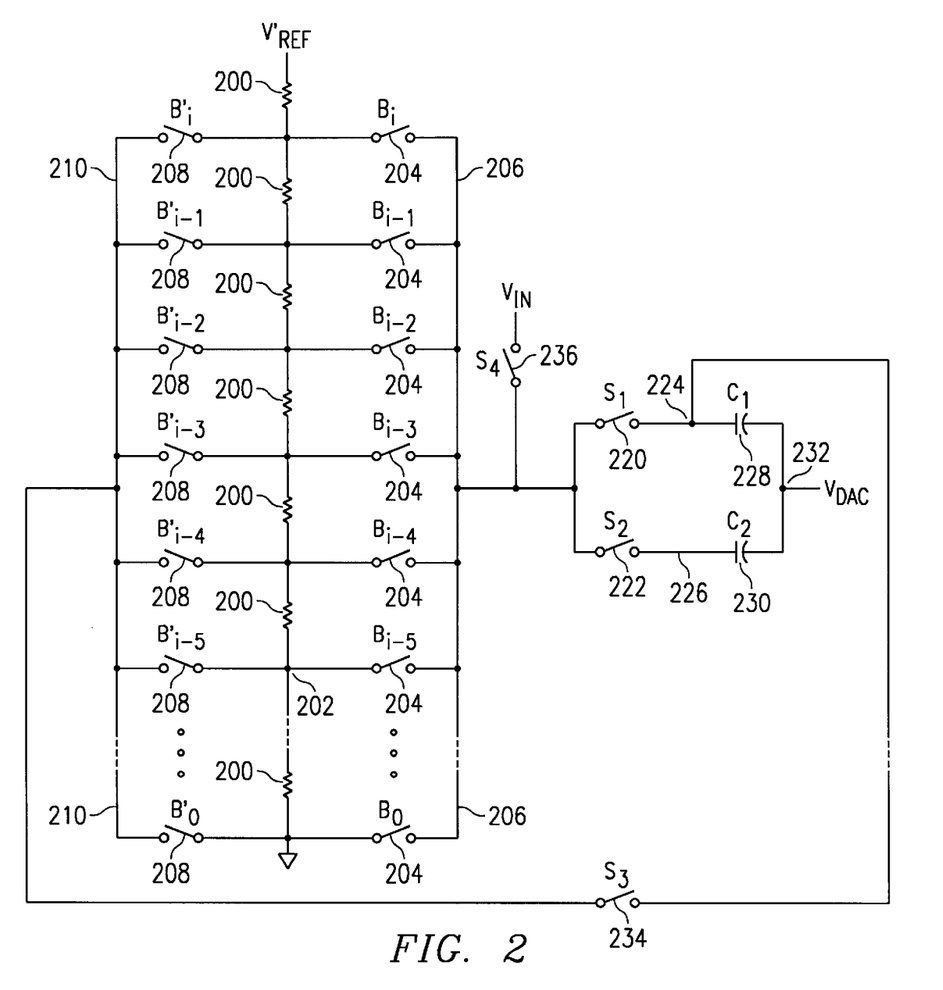
FIG. 2 illustrates a more detailed schematic diagram of the DAC portion of the analog/digital converter.

Referring now to FIG. 2, there is illustrated a schematic diagram of one embodiment of the DAC of the present disclosure. The MSB DAC 100 is comprised of a plurality of resistors 200 disposed in a resistor string connected between the voltage $V'_{REF}$ and ground. Between each of the resistors 200 is provided a tap 202. Each of the taps 202 has a switch 204 connected between the associated tap 202 and a node 206, and a switch 208 connected between the associated node 202 and a node 210. The switches 204 are labeled B and the switches 208 are labeled B'. The switches are labeled as having values from $B'_0$ through $B'_i$ and the switches 208 are labeled as having values from $B'_0$ through $B'_i$. The switches 204, as will be described hereinbelow, are provided to select the value for the MSB DAC, and the switches 208 are provided to switch in the value for the sub-DAC 102.

Connected to the node 206 are one side of two switches, a switch 220 labeled $S_1$ and a switch 222 labeled $S_2$. The other side of switch 220 is connected to a node 224 and the other side of switch 222 is connected to a node 226. Node 224 is connected to one side of a capacitor 228, labeled $C_1$ and the node 226 is connected to one side of a capacitor 230 labeled $C_2$. The other plates of capacitors 228 and 230 are connected to an output node 232 to provide the output voltage $V_{DAC}$. Node 224 is connected to node 210 through a switch 234 labeled $S_3$. Node 206 is connected to the input voltage to the A\D converter $V_n$ through a switch 236 labeled $S_4$.

As will be described hereinbelow, switches 220 and 222 are closed, switches 208 and 204 are opened and switch 236 is closed in order to place the voltage $V_n$ on node 206, switch 234 being open. This basically sets one side of the capacitors 228 and 230 to voltage $V_n$, while the output node 232 is set to some reference voltage. Switch 236 will then be opened and the successive approximation search for the MSB performed utilizing switches 204, the selected switch 204 then remaining closed. Thereafter, switch 222 will remain closed, switch 220 will be opened and switch 234 will be closed, and then the SubDAC will be search performed with switches 208. This will be described in more detail hereinbelow.

Figure 3:
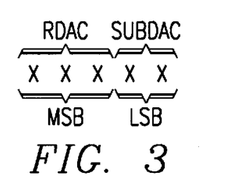
FIG. 3 illustrates a diagrammatic view of the two portions of DAC output and their association with the sections of the DAC.

Referring now to FIG. 3, there is illustrated a diagrammatic view of the relationship between the output digits of the A/D converter and the MSB DAC 100 and the LSB DAC 102. The first search is performed with the upper MSBs and this is referred to as the "resistor DAC" portion (RDAC), and the LSB portion is performed with the SubDAC, which is a combination of the capacitors 228 and 230 and the switches 208. The search is first performed with the RDAC and then with the SubDAC.

Figures 4, 4A:
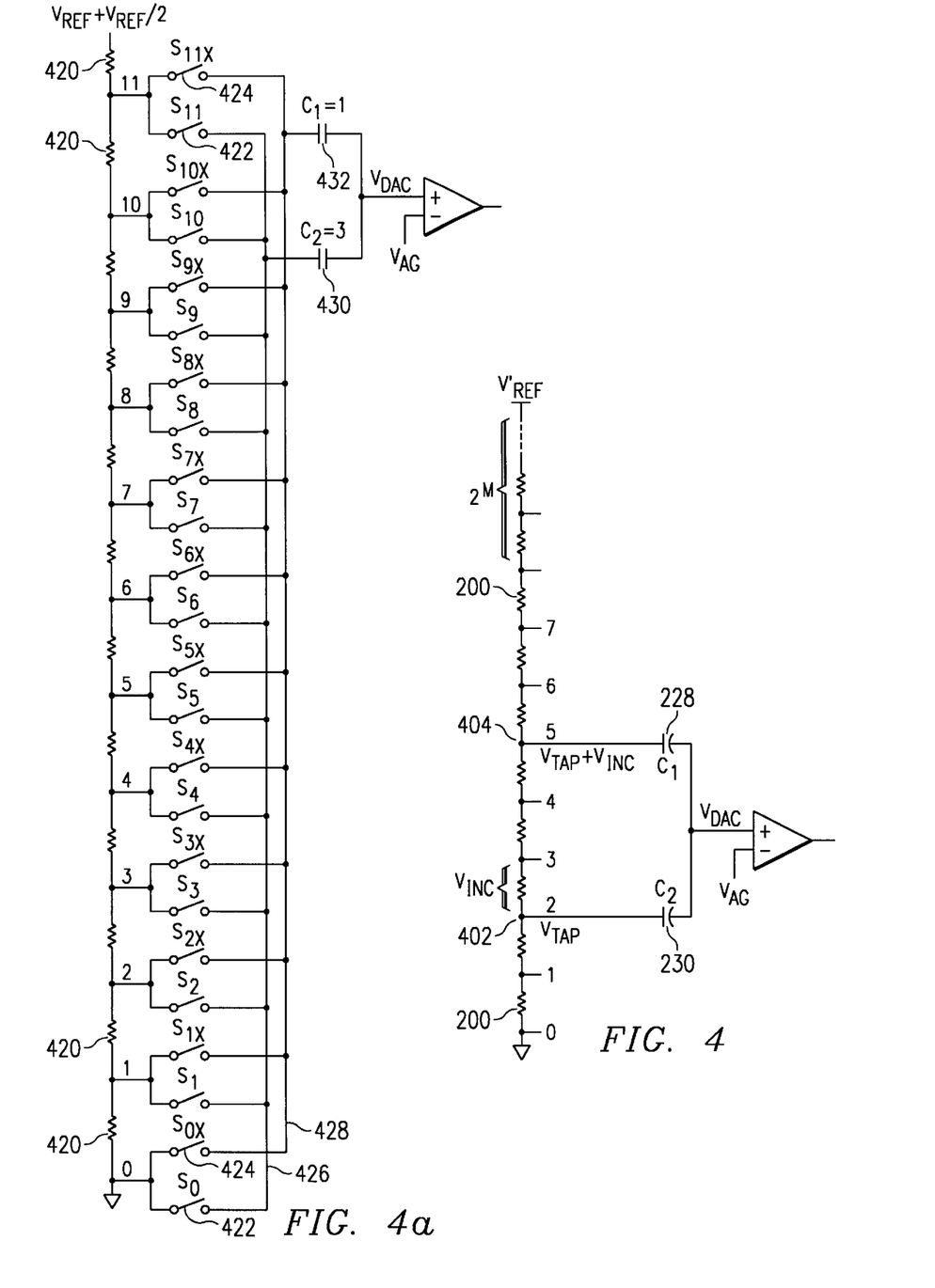
FIG. 4 illustrates a schematic diagram of one interconnection operation of the DAC for one interconnection configuration.
FIG. 4a illustrates a schematic diagram of an eight bit RDAC and a four bit SubDAC.

Referring now to FIG. 4, there is illustrated a schematic diagram of a three-bit RDAC having eight resistors 200 and the switches (not shown) in their final configuration after the successive-approximation search. Since the RDAC indices is N, then there will be $2^N$ resistors 200. The capacitors 228 and 230 are illustrated as being interconnected in the final configuration after the approximation, i.e., capacitor 230 is connected to one tap, namely tap 402, and the other plate of capacitor 228 is connected to a tap 404, tap 402 and 404 being identical to taps 202 in FIG. 2. Since the RDAC is a three-bit DAC, this means the plate of capacitor 230 can be connected to each of the eight taps in the resistor string illustrated in FIG. 4. As illustrated, the tap 402 is the third tap in the resistor string with the voltage across each of the resistors being an incremental voltage $V_{INC}$ such that the voltage on node 402 is equal to $2V_{INC}$ which is equal to a tap voltage $V_{TAP}$. There are i taps in the resistor string, as will be described hereinbelow. Therefore, there will be required for the RDAC portion $2^3$ taps and resistors, but for the SubDAC there will be required $2^M$ additional resistors and taps, such that the number of resistors in the resistor string will be $2^M+2^N$ which will equal $2^{M+N}$. If one considers the example of a 5-bit converter with M+N=5 without the use of the RDAC and the SubDAC, this would require $2^5$ resistors or 32 resistors, as compared to only 12 resistors in the disclosed embodiment for the same 5-bit converter.

Referring now to FIG. 4a, there is illustrated a schematic representation of a five-bit combination of the RDAC and the SubDAC. There are provided 12 resistors 420 connected between ground and a voltage $V_{REF}+V_{REF}/2=V'_{REF}$. At each of the twelve taps, there are connected one side of two switches 422 and 424, labeled $S_i$ and $S_{ix}$, with i ranging from 0 through 11. The other side of all of the switches 422 are connected to a node 426 and the other side of the switches 424 are connected to a node 428. The node 426 is connected to one side of a capacitor 430 and the node 428 is connected to one side of a capacitor 432. A capacitor 432 is labeled $C_1$ and the capacitor 430 is labeled $C_2$. The relative value of the capacitor 432 is given as "1" and the relative value of capacitor 430 is given as "3" with a total value of "4." These are relative values.

In operation, both switches 422 and 424 are initially open and then the value of i for the ith switch 422 is determined by incrementally closing the switches 422 and 424 together for each successive tap between resistors 420. When the value of i for the switch 422 ($S_i$) is determined for the MSBs, then the value for the LSBs is then determined. The two LSB values associated with the M value are then determined by leaving closed the switch 422 for the ith determined value of switch 422, and then changing the switches 424 from the starting value of ix=i. This will then take the plate of capacitor 432 up to a different voltage, which can be incremented up only four taps or four incremental voltage steps, $V_{INC}$.

By way of example, assume $V_{REF}$ is set equal to 1.00 volt and a digital input signal of 11010 representing an analog value of 0.8125 is desired. The three MSBs, 110, would then turn on switches $S_6$ and $S_{6x}$, yielding an output of voltage of 0.75 volts, since each incremental voltage across each of the resistors 420 is 0.125 volts. An additional amount of 0.0625 volts is required. Therefore, if switch $S_{6x}$, one of the switches 424, is opened and then the next switch, switch $S_{7x}$, is closed, the applicable voltage will then change to:

$$V_{DAC} = 0.75 + \left(\frac{1}{8}\right)\left(\frac{1}{4}\right) = 0.78125$$

If, on the other hand, the next switch, switch $S_{8x}$ is required to be closed for the next increment of the search, the output voltage will change to:

$$V_{DAC} = 0.75 + \left(\frac{2}{8}\right)\left(\frac{1}{4}\right) = 0.8125$$

which is the desired value. The general equation for the output voltage is:

$$V_{DAC} = V_{RDAC} + V_{SubDAC}\frac{C_1}{C_1 + C_2}$$

where:

$V_{RDAC}$=the voltage at the resistor string tap where one of the switches 422 is closed $V_{SubDAC}$=the incremental voltage $V_{INC}$ multiplied by the number of taps required above the ith tap.

It can be seen that the capacitors 430 and 432 need to be ratioed such that the value of capacitor 432 is a relative value of "1" and the value of capacitor 430 is the relative value of "$2^{M-1}$." In this scheme, the upper three MSBs are taken from taps along the RDAC portion of the DAC with both capacitors 430 and 432 tied in parallel initially. The lower two LSBs are then obtained by connecting taps above the tap determined by the three MSBs using only the capacitor 432 and depending upon the proper ratio for capacitors 430 and 432. Due to the fact that the entire span of the DAC must be $V_{REF}$-$V_{LSB}$, additional resistors are required, but significantly fewer than if the RDAC were implemented without the SubDAC.

In general, the DAC is implemented with M MSBs and N LSBs. In the example above, M=3 and N=2. The resistor string is made up of $2^M + 2^N$ resistors. The value of the SubDAC capacitors are:

$C_1 = 1$ $C_2 = 2^{N} - 1$

The actual reference that is provided to this DAC must be modified from what would normally be required. In order to achieve a true LSB value of:

$$V_{LSB} = \frac{V_{REF}}{2^{(M+N)}}$$

a modified reference voltage, $V'_{REF}$, is required where:

$$V'_{REF} = \frac{2^N}{2^M}V_{REF} + V_{REF}$$

Figures 5, 6, 7, 8:
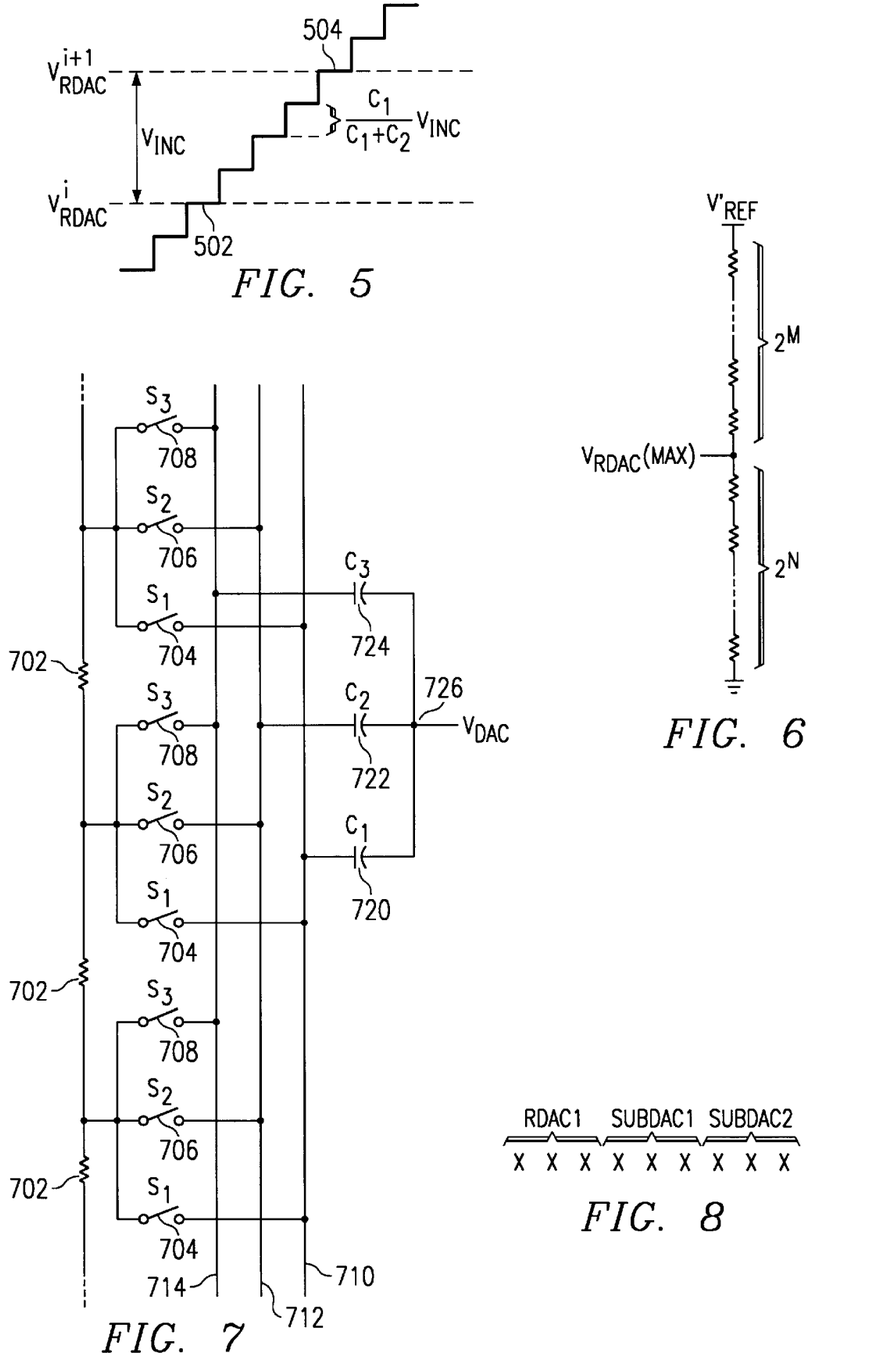
FIG. 5 illustrates a step diagram illustrating the MSB and LSB increments.
FIG. 6 illustrates a schematic diagram of the resistor string.
FIG. 7 illustrates an alternate embodiment of the disclosed DAC utilizing additional levels of the capacitor portion of the DAC.
FIG. 8 illustrates a diagrammatic representation of the segmentation of the output and the association therewith of the DAC segments.

Referring now to FIG. 5, there is illustrated a diagrammatic view of the searching algorithm. It can be seen that the value of $V_{RDAC}$ can vary with an index of i from 0 through 11, but that only values of 0 through 8 would be utilized. The selected value of $V_{RDAC}$ is $V^i_{RDAC}$. This will result in a first value at a level 502. This represents a point at which switches 422 and 424 are closed for the ith tap. If the next tap was selected with both switches 422 and 424 closed, then a value 504 would be selected, this representing the voltage value $V^{i+1}_{RDAC}$. If this value 504 is too high, then the switches 422 and 424 will be selected such that the ith tap is selected. Thereafter, the value between the two values 502 and 504 must be determined with the SubDAC. The total voltage between the two values 502 and 504 is $V_{INC}$, the voltage across any one of the resistors 420. Each of the steps is a ratio of the capacitor $C_1$ to the total capacitor value ($C_1+C_2$) multiplied by the incremental voltage $V_{INC}$, or $C_1\backslash(C_1+C_2)*V_{INC}$. This will be added to the voltage $V^i_{RDAC}$. The total voltage will be the sum of the voltage $V^{IN}_{RDAC}$ and the number of taps times the step voltage. It can be seen that each increment must, by definition, increase, since the voltage increment is defined by a resistor which inherently does increase. The size of the voltage, however, is defined by the ratio the capacitors, which is constant for all increments.

Referring now to FIG. 6, there is illustrated a diagrammatic view of the resistor string showing there are $2^M$ resistors for the taps going up to the maximum value of the $V_{RDAC}$. There are required an additional $2^N$ resistors for the SubDAC. Of course, if there are less than 2 resistors required for the $V_{RDAC}$ value, then a portion of the $2^M$ resistors will be used for the $2^N$ SubDAC resistors.

Referring now to FIG. 7, there is illustrated a partial schematic diagram of a configuration utilizing multiple SubDACs. In this configuration, there are provided a plurality of resistors 702 in a resistor string, each providing a tap output. In each of the tap outputs, there are provided three parallel switches 704, 706 and 708 labeled $S_1$, $S_2$ and $S_3$ respectively. The switches 704 and 708 are connected to the associated resistor tap and the other sides of the switches 704 and 708 are connected to nodes 710, 712 and 714, respectively. Node 710 is connected to one side of a capacitor 720 labeled $C_1$, node 712 is connected to one side of a capacitor 722, labeled $C_2$ and node 714 is connected to one side of a capacitor 724, labeled $C_3$. The other sides of the capacitors 720–724 are connected to a common node 726 for the output of the DAC.

Referring now to FIG. 8, there is illustrated a diagrammatic view of the bit resolution of the DAC of FIG. 7 and how this is divided between the various DACs. The first three bits, the three MSBs, are associated with the RDAC, the next three bits are associated with the first SubDAC and the last three or LSBs are associated with the second SubDAC. Initially, all three switches 704–708 for each successive tap are connected together and to the one plate of capacitors 720–724, such that they are all at the voltage of the tap. Initially, this tap will be at $V_{IN}$, with $V_{DAC}$ set to some reference voltage and then the search will proceed to determine which tap is closest to $V_{IN}$. Once this tap is determined, then that switch 704 for that particular tap is left closed and then switches 706 and 708 are selectively closed for increasing taps on the resistor string until the appropriate voltage is fixed. At this point, switch 706 is retained in a closed position at that tap, and then the search continues with switch 708 upwards along the resistor string. This will, therefore, require $2^N$ resistors for the RDAC, $2^M$ additional resistors for the first SubDAC and $2^z$ for the second SubDAC for a total of $2^{M+N+Z}$ resistors for an (M+N+Z) bit resolution DAC.

Figure 9:
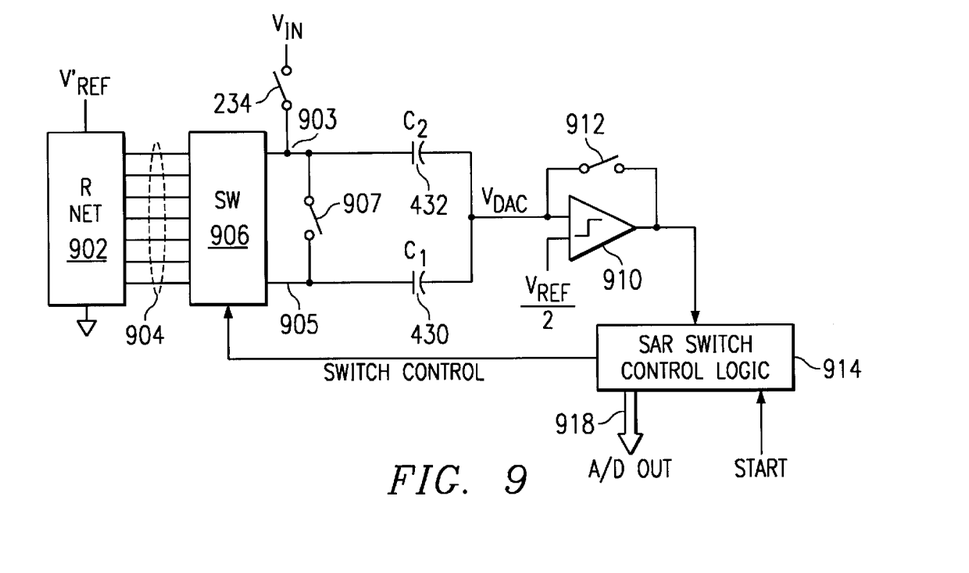
FIG. 9 illustrates a block diagram of the overall A\D successive-approximation register converter.

Referring now to FIG. 9, there is illustrated an overall A\D converter utilizing the DAC disclosed herein. The resistor string is represented by a resistor network 902 which is connected between the $V'_{REF}$ and ground. This provides a plurality of taps 904 on the output therefrom for input to a switch network 906, which is comprised of the switches 204 and 208 of FIG. 2, also switch 234, and, alternately, the switches 422 and 424 of FIG. 4a. The output of the switch block 906 provides two outputs, an output 903 and an output 905. Output 905 is connected to one side of the capacitor 430 and output 903 is connected to one side of the capacitor 432, with output 903 connected through the switch 234 to the input voltage of $V_{IN}$. A switch 907 is disposed between outputs 903 and 905. The other side of the capacitors 430 and 432, the $V_{DAC}$ node, is input to the input of a comparator 910, the other input of the comparator is connected to the reference voltage $V_{REF}/2$, or some other appropriate reference voltage. There is provided a switch in feedback across the $V_{DAC}$ input and the output thereof with a series switch 912 disposed therein. The switch 912 is closed whenever the switch 234 is closed during the initial operation wherein $V_{IN}$ is impressed on the one side of the capacitors 430 and 432. The output of the comparator 910 is input to a successive-approximation register switch control logic block 914 which provides switch controls therefrom to the switching block 906. Additionally, there is provided a digital output on a bus 918 which is the M+N wide bus output. A start input is provided for the control logic block 914 to initiate the successive-approximation operation as described hereinabove.

Figure 10:
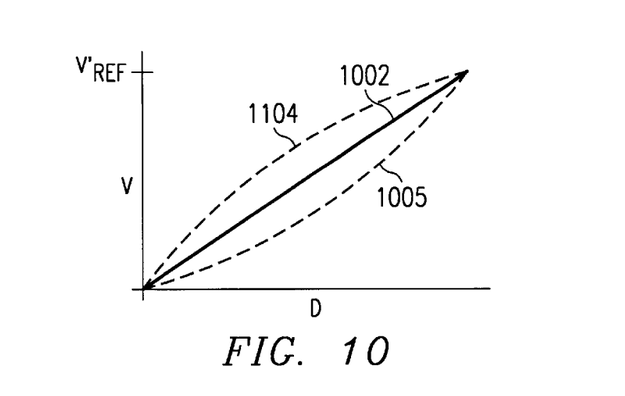
FIG. 10 illustrates a plot of the resistor linearity for the resistor string.

Referring now to FIG. 10, there is illustrated a plot of the voltage verses data input. For the linear operation, there is represented a curve 1002. However, due to errors in the resistors, there will be an upper bound 1004 and a lower bound 1005. It can be seen that this error increases at the voltage V' increases at the mid point between ground and $V'_{REF}$.

Figure 11:
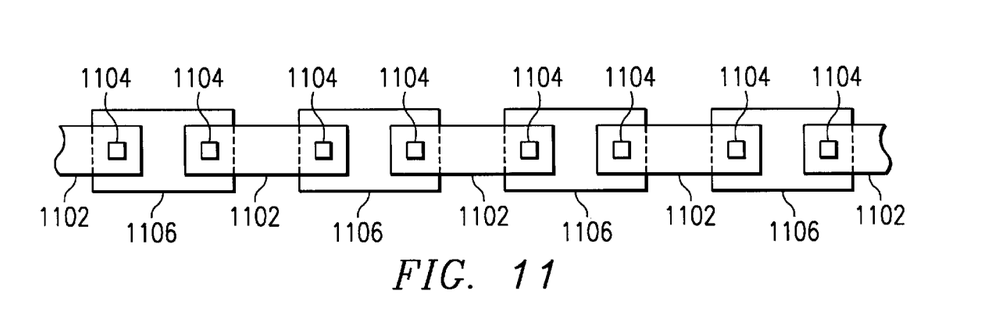
FIG. 11 illustrates a layout of a conventional resistor string.

Referring now to FIG. 11, there is illustrated a top planar view of a resistor string, which resistor string is comprised of a plurality of polycrystalline silicon (poly) resistors 1102. Each of the resistors 1102 has associated therewith a tungsten plug contact 1104 on either side thereof. (It should be understood that contact 1104 could be realized with any other ohmic contact mechanism). A metal contact is provided as a tap in the form of a metal region 1106 disposed between the tungsten plugs of adjacent resistors. These provide the taps.

Figure 12:
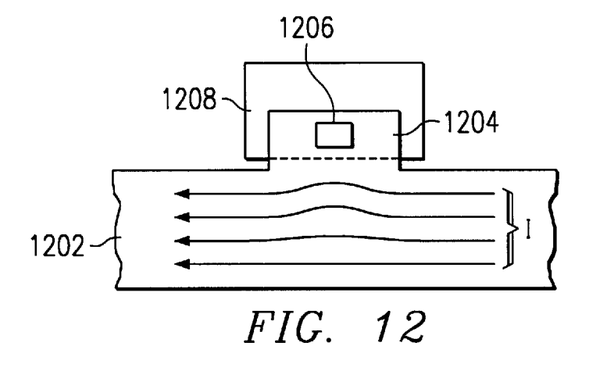
FIG. 12 illustrates a detail of a layout for a single resistor tap.

Referring now to FIG. 12, there is illustrated an alternate method for manufacturing the taps. This is comprised of a long resistive conductive element 1202, typically fabricated of poly, with a protrusion 1204 extending from the side thereof at the correct tap position in the resistor string. A tungsten plug 1206 is provided for interfacing with an upper metal layer patterned and etched to form a tap 1208. The disadvantage to this is that the resistance varies slightly in a distributed manner across the resistor at the cross section of the tap 1206. Therefore, it can be seen that the current will change at positions proximate to the protrusion 1204 as compared to positions diametrically opposite therefrom in the resistive element 1202. This will cause the resistor to have anomalies, these anomalies due to not only to the design but also to the manufacturing processes.

Figure 13:
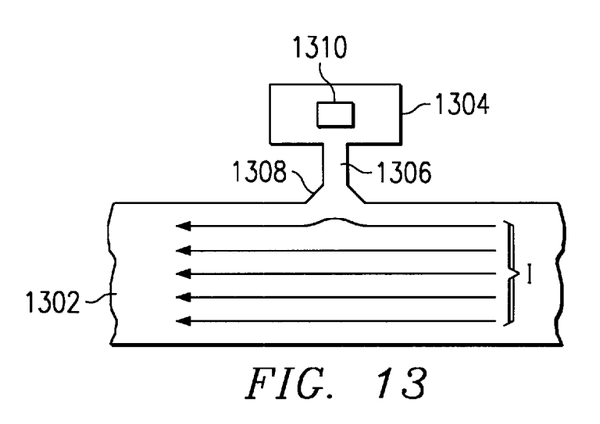
FIG. 13 illustrates a detail of a resistor tap utilizing a narrow neck.

Referring now to FIG. 13, there is illustrated an alternate embodiment of that of FIG. 12, wherein there is provided a conductor strip 1302 which is a long strip connected between the power supply of voltage $V'_{REF}$ and ground. The contacts are formed by a conductive pad 1304 formed in the poly layer with a narrow "neck" portion 1306 connected therebetween. At the point where the neck 1306 intersects the conductor strip 1302, there is provided a chamfer 1308 which is a small expanded area. The current profile is illustrated with directional arrows, and it can be seen that this current profile provides a minimal variation to the current, due to the fact that the resistance variation is very small at the point proximate to the neck 1306 where it intersects with the conductor strip 1302. There is provided a tungsten plug 1310 for interfacing with the upper metal layer contact (not shown). The narrow neck 1306 has a width $W_N$ and the conductor strip 1302 has a width $W_R$. The benefit of the narrow verses wide neck 1306 is seen in the ratio $W_N/W_R$, in that it is desirable to minimize this value.

Figure 14:
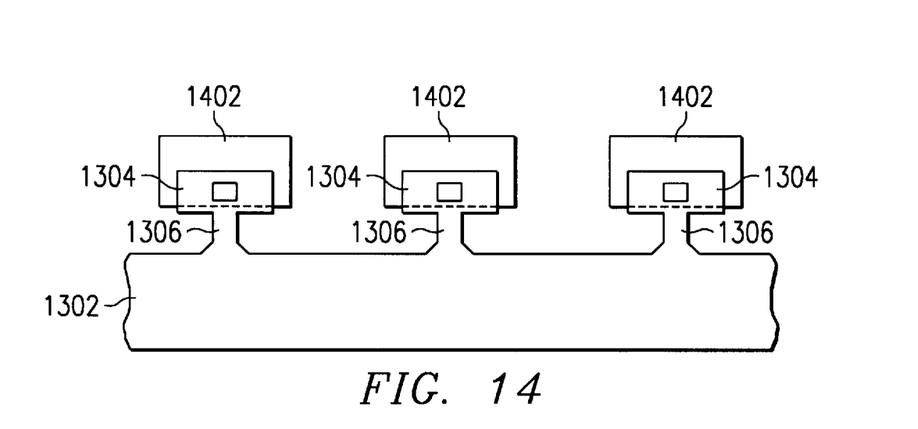
FIG. 14 illustrates a plurality of the resistor taps of FIG. 13.

Referring now to FIG. 14, there is illustrated an expanded view of the embodiment of FIG. 13. It can be seen that the conductive paths 1304 are disposed at evenly spaced distances along the conductor strip 1302. A patterned metal contact 1402 is illustrated as being interfaced with the tungsten plug 1310 in a different layer.

Although the preferred embodiment has been described in detail, it should be understood that various changes, substitutions and alterations can be made therein without departing from the spirit and scope of the invention as defined by the appended claims.

What is claimed is:

1. An analog-to-digital converter having a digital-to-analog converter section for converting a Z-bit digital word defining M most significant bits and N least significant bits, the digital-to-analog converter section comprising:
    an MSB portion for receiving said M most significant bits, and selecting a first analog voltage from a plurality of equal voltage increments $V_{INC}$;
    a SubDac portion for receiving said N least significant bits, and selecting a second analog voltage from said plurality of equal voltage increments $V_{INC}$; and
    a summing circuit using the first analog voltage and the second analog voltage to provide an analog output voltage with an M+N bit resolution, where Z=M+N.

2. The converter of claim 1, further including at least two capacitors, said capacitors connected in parallel during a determination of an analog voltage corresponding to the M bits, and connected in series during a determination of an analog voltage corresponding to the N bits.

3. The converter of claim 2, wherein said capacitors each have a different capacitance value, said capacitance value being a function of the number of N bits.

4. The converter of claim 3, further including a pair of said capacitors with respective relative values of $C_1=1$ and $C_2=2^N-1$.

5. The converter of claim 2, further including a plurality of switches for coupling analog voltages from nodes of said resistor string to said capacitors, including a first set of switches coupling the respective nodes to one said capacitor, and a second set of switches coupling the respective nodes to a different said capacitor.

6. The converter of claim 5, further including a switch driver for closing one switch from each said set of switches during the determination of an MSB, and closing a switch from only one said set of switches during the determination of an LSB.

7. The converter of claim 5, further including a set of said switches associated with a respective said capacitor.

8. The converter of claim 1, further including:
    a plurality of voltage taps where an analog voltage between each voltage tap is $V_{INC}$, and where the first and second analog voltages are selected from ones of said voltage taps;
    a divider for dividing a difference between the first and second analog voltages by $2^N$ to provide an analog voltage of $V_{INC}$ multiplied times the number of voltage taps separating the first analog voltage and the second analog voltage, divided by $2^N$ to provide a divided voltage; and
    said summing circuit sums the first analog voltage and the divided voltage.

9. The converter of claim 8, wherein said summing circuit comprises a first capacitor coupled between said first analog voltage and said summer, and a second capacitor coupled between the second analog voltage and said summer, said second capacitor having a relative value of C, and said first capacitor having a relative value of $C(2^N-1)$.

10. The converter of claim 1, wherein said MSB portion comprises:

a first resistor string with a plurality of voltage taps, a voltage between each voltage tap defined by $V_{INC}$; and a voltage tap selector for selecting the one of said voltage taps on said first resistor string corresponding to said M bits of said digital word to provide said first analog voltage.

11. The converter of claim 1, wherein said SubDac portion comprises:

a second resistive string having a plurality of voltage taps and referenced on one end thereof to said first analog voltage;

a voltage tap selector for selecting the one of said voltage taps on said second resistor string corresponding to said N bits of said digital word to provide said second analog voltage; and said summing circuit comprises a capacitive divider disposed between said selected voltage tap for said first resistor string and said selected tap for said second resistor string for dividing the voltage difference between said first and second analog voltages.

12. The converter of claim 1, further including a plurality of resistors defining a resistor string, each resistor of said resistor string being of substantially identical value, and said resistor string providing analog voltages to both said MSB portion and said SubDac portion.

13. In an analog-to-digital converter having a digital-to-analog converter, a method for converting a Z-bit digital word defining M most significant bits and N least significant bits into a corresponding analog output voltage, comprising the steps of:

selecting an MSB voltage tap from a plurality of voltage taps to provide a first analog voltage corresponding to the M bits of the digital word, where an analog voltage between each voltage tap is substantially identical;

coupling the first analog voltage to a first capacitor and to a second capacitor;

maintaining the first capacitor coupled to the MSB voltage tap providing the first analog voltage, and selecting another voltage tap defining an LSB voltage tap from the plurality of voltage taps to provide a second analog voltage corresponding to the N bits of the digital word;

coupling the second capacitor to the second analog voltage; and coupling the first and second capacitors together to produce a summation of a) the first analog voltage, and b) a difference between the second analog voltage and the first analoge voltage divided by a factor determined by the respective values of said first and second capacitors.

14. The method of claim 13, further including using first and second capacitors having relative values of $C_1=1$ and $C_2=2^N-1$.

15. The method of claim 14, further including using the first capacitor as $C_2$ and using the second capacitor as $C_1$.

16. The method of claim 13, further including connecting said first and second capacitors in parallel during the selection of the first analog voltage, and connecting said first and second capacitors in series during the selection of the second analog voltage.

17. The method of claim 13, further including selecting the first and second analog voltages from a resistor string having equal value resistors joined together at said voltage taps.

* * * * *